(12) United States Patent
Patil et al.

(10) Patent No.: US 9,573,814 B2
(45) Date of Patent: Feb. 21, 2017

(54) HIGH-THROUGHPUT GRAPHENE PRINTING AND SELECTIVE TRANSFER USING A LOCALIZED LASER HEATING TECHNIQUE

(71) Applicant: THE TRUSTEES OF THE STEVENS INSTITUTE OF TECHNOLOGY, Hoboken, NJ (US)

(72) Inventors: Vikram Patil, Goleta, CA (US); Youn-Su Kim, Seoul (KR); Kitu Kumar, Princeton Junction, NJ (US); Eui-Hyeok Yang, Fort Lee, NJ (US)

(73) Assignee: The Trustees of the Stevens Institute of Technology, Hoboken, NJ (US)

( * ) Notice: Subject to any disclaimer, the term of this patent is extended or adjusted under 35 U.S.C. 154(b) by 491 days.

(21) Appl. No.: 14/185,350

(22) Filed: Feb. 20, 2014

(65) Prior Publication Data

US 2014/0231002 A1 Aug. 21, 2014

Related U.S. Application Data

(60) Provisional application No. 61/766,956, filed on Feb. 20, 2013.

(51) Int. Cl.
*H01L 21/02* (2006.01)
*C01B 31/04* (2006.01)
*H01L 29/66* (2006.01)

(52) U.S. Cl.
CPC ..... *C01B 31/0453* (2013.01); *H01L 29/66015* (2013.01); *Y10T 156/1705* (2015.01)

(58) Field of Classification Search
CPC ..................... Y10T 156/1705; H01L 29/66015
(Continued)

(56) References Cited

U.S. PATENT DOCUMENTS 4,772,924 A 9/1988 Bean et al.
4,903,101 A 2/1990 Maserjian
(Continued)

FOREIGN PATENT DOCUMENTS

WO 2012073998 A1 6/2013
WO 2013119295 8/2013

OTHER PUBLICATIONS

Bae et al., Roll-to-roll production of 30-inch graphene films for transparent electrodes, Nature Nanotechnology, Jun. 20, 2010, pp. 574-578.*

(Continued)

*Primary Examiner* — Scott W Dodds
(74) *Attorney, Agent, or Firm* — Greenberg Traurig, LLP

(57) ABSTRACT

A method of high-throughput printing and selective transfer of graphene onto a substrate includes the steps of: providing a thermal release tape having graphene adhered thereto; placing a substrate onto the graphene; pressing the thermal tape and the graphene against the substrate at a uniformly-distributed pressure; heating localized portions of the thermal tape and graphene using a localized heat source, thereby diminishing the adhesive properties of the thermal release tape in the localized portions and transferring graphene from said localized portions to the substrate; and separating the thermal release tape from the substrate. The method may include the further step of moving the localized heat source to selected positions on the thermal release tape during the heating step, thereby forming a pattern of heated portions. The method may use a laser beam as the localized heat source, movement of the laser beam being performed by a computer-controlled deflectable mirror.

2 Claims, 1 Drawing Sheet

(58) Field of Classification Search
USPC .......................................................... 156/234
See application file for complete search history.

(56) References Cited

U.S. PATENT DOCUMENTS

| | | | |
|---|---|---|---|
| 5,238,868 | A | 8/1993 | Elman et al. |
| 6,813,064 | B2 | 11/2004 | John et al. |
| 7,167,355 | B2 | 1/2007 | Chen |
| 7,217,951 | B2 | 5/2007 | Krishna et al. |
| 7,387,253 | B1 | 6/2008 | Parker et al. |
| 7,550,755 | B2 | 6/2009 | Balkenende et al. |
| 7,628,928 | B2 | 12/2009 | Guerra |
| 7,830,926 | B1 | 11/2010 | Kim |
| 7,852,613 | B2 | 12/2010 | Ma et al. |
| 8,098,482 | B2 | 1/2012 | Clelland et al. |
| 8,206,469 | B2 | 6/2012 | Chiang et al. |
| 8,278,757 | B2 | 10/2012 | Crain |
| 8,455,842 | B2 | 6/2013 | Zhang |
| 8,697,485 | B2 | 4/2014 | Crain et al. |
| 8,810,996 | B2 | 8/2014 | Lee et al. |
| 8,878,120 | B2 | 11/2014 | Patil et al. |
| 2003/0012249 | A1 | 1/2003 | Eisenbeiser |
| 2007/0215855 | A1 | 9/2007 | Kang |
| 2010/0207254 | A1 | 8/2010 | Jain et al. |
| 2011/0042813 | A1 | 2/2011 | Crain |
| 2011/0052813 | A1 | 3/2011 | Ho |
| 2011/0101309 | A1 | 5/2011 | Lin et al. |
| 2012/0007913 | A1 | 1/2012 | Jang |
| 2012/0121891 | A1 | 5/2012 | Kim |
| 2012/0128983 | A1 | 5/2012 | Yoon |
| 2012/0170171 | A1 | 7/2012 | Lee |
| 2012/0235119 | A1 | 9/2012 | Babich et al. |
| 2012/0244358 | A1 | 9/2012 | Lock |
| 2012/0255860 | A1 | 10/2012 | Briman et al. |
| 2012/0270205 | A1 | 10/2012 | Patel |
| 2013/0264011 | A1 | 10/2013 | Lin |
| 2013/0264192 | A1 | 10/2013 | Lin |
| 2013/0264193 | A1 | 10/2013 | Lin |
| 2013/0264307 | A1 | 10/2013 | Lin |
| 2013/0266729 | A1 | 10/2013 | Lin |
| 2014/0103298 | A1 | 4/2014 | Lee |
| 2014/0127584 | A1 | 5/2014 | Kim et al. |
| 2014/0205841 | A1 | 7/2014 | Qiu et al. |
| 2014/0321028 | A1 | 10/2014 | Lee et al. |

OTHER PUBLICATIONS

Caldwell et al., Technique for the Dry Transfer of Epitaxial Graphene onto Arbitrary Substrates, ACSNano, Jan. 25, 2010, pp. 1108-1114.*
Zhou, M. et al., Controlled Synthesis of Large-Area and Patterned Electrochemically Reduced Graphene Oxide Films, Chem. Eur. J., 2009, 15, pp. 6116-6120.
Notice of Allowance mailed Jan. 22, 2015 in reference to U.S. Appl. No. 14/327,716.
Non-Final Office Action mailed Aug. 15, 2014 in reference to U.S. Appl. No. 14/327,716.
Non-Final Office Action mailed Dec. 6, 2013 in reference to U.S. Appl. No. 13/301,124.
Final Office Action mailed Jun. 25, 2014 in reference to U.S. Appl. No. 13/324,622.
First Action Interview Program Communication mailed Nov. 6, 2014 regarding U.S. Appl. No. 14/053,232.
Akhavan, O. et al., Toxicity of graphene and graphene oxide nanowalls against bacteria, ACS Nano, 4 (2010) 5731-5736.
Bolotin, K. et al., Ultrahigh electron mobility in suspended graphene; Solid State Communications, 146 (2008) 351-355.
Bourlinos, A. et al., Graphite oxide: Chemical reduction to graphite and surface modification with primary aliphatic amines and amino acids, Langmuir, 19 (2003) 6050-6055.
Chen, Z. et al., Three-dimensional flexible and conductive interconnected graphene networks grown by chemical vapour deposition, Nature Materials, 10 (2011) 424-428.
Coleman, J.N., Liquid-Phase Exfoliation of Nanotubes and Graphene, Advanced Functional Materials, 19 (2009) 3680-3695.
Cote, L. et al., Flash Reduction and Patterning of Graphite Oxide and Its Polymer Composite, Journal of the American Chemical Society, 131 (2009) 11027-11032.
Dikin, D. et al., Preparation and characterization of graphene oxide paper, Nature, 448 (2007) 457-460.
Dreyer, D. et al., The chemistry of graphene oxide, Chemical Society reviews, 39 (2010) 228-240.
Dreyer, D. et al., From Conception to Realization: An Historical Account of Graphene and Some Perspectives for Its Future, Angewandte Chemie International Edition, 49 (2010) 9336-9344.
El-Kady, M. et al., "Laser Scribing of High-Performance and Flexible Graphene-Based Electrochemical Capacitors," Science, vol. 335, No. 6074, pp. 1326-1330, Mar. 2012.
Gao, X. et al., Hydrazine and thermal reduction of graphene oxide: Reaction mechanisms, product structures, and reaction design, Journal of Physical Chemistry C, 114 (2010) 832-842.
Hong, A. et al., "Graphene Flash Memory," ACS Nano 5 (10), 7812-7817 (2011).
Ferrari, A. et al., Inkjet-Printed Graphene Electronics; ACS Nano, vol. 6, No. 4,2992-3006, (2012).
Kim, F. et al., Graphene oxide: Surface activity and two-dimensional assembly, Advanced Materials, 22 (2010) 1954-1958.
Kim, J. et al., Graphene oxide sheets at interfaces, Journal of the American Chemical Society, 132 (2010) 8180-8186.
Kong, D. et al., Temperature-Dependent Electrical Properties of Graphene Inkjet-Printed on Flexible Materials, Langmuir, ACS Publications, American Chemical Society, 28, (2012) pp. 13467-13472.
Lee, Y. et al., "Wafer-Scale Synthesis and Transfer of Graphene Films," Nano Letters 10 (2), 490-493 (2010).
Li, D. et al., Processable aqueous dispersions of graphene nanosheets, Nat Nano, 3 (2008) 101-105.
Li, X. X et al., Large-Area Synthesis of High-Quality and Uniform Graphene Films on Copper Foils, Science, 324 (2009) 1312-1314.
Lin, Y. et al., "100-GHz Transistors from Wafer-Scale Epitaxial Graphene," Science, 327 (2010) p. 662.
Lin, Y. et al., "Wafer-Scale Graphene Integrated Circuit," Science 332 (6035), 1294-1297 (2011).
Luo, J. et al., Compression and Aggregation-Resistant Particles of Crumpled Soft Sheets, ACS Nano, 5 (2011) 8943-8949.
Luo, J. et al., Graphene oxide nanocolloids, Journal of the American Chemical Society, 132 (2010) pp. 17667-17669.
Novoselov, K. et al., Electric Field Effect in Atomically Thin Carbon Films, Science, 306 (2004) pp. 666-669.
Park, J. et al., Multi-scale graphene patterns on arbitrary substrates via laser-assisted transfer-printing process, Applied Physics Letters, vol. 101, No. 4, (2012) p. 043110-043110-4.
Park, S. et al., Chemical methods for the production of graphenes, Nat Nano, 4 (2009) 217-224.
Shag, G. et al., Graphene oxide: The mechanisms of oxidation and exfoliation, Journal of Materials Science, 47 (2012) 4400-4409.
Stankovich, S. et al., Synthesis of graphene-based nanosheets via chemical reduction of exfoliated graphite oxide, Carbon, 45 (2007) 1558-1565.
Stoller, M. et al., Graphene-Based ultracapacitors; Nano Letters, 8 (2008) 3498-3502.
Torrisi, F. et al., Inkjet-Printed Graphene Electronics, ACS NANO, vol. 6, No. 4, (2012) 2992-3006.
Wu, Z.S. et al., Graphene/metal oxide composite electrode materials for energy storage, Nano Energy, 1 (2012) 107-131.
Zangmeister, C.D., Preparation and evaluation of graphite oxide reduced at 220 c, Chemistry of Materials, 22 (2010) 5625-5629.
Zhang, Y. et al., Cytotoxicity effects of graphene and single-wall carbon nanotubes in neural phaeochromocytoma-derived pc12 cells, ACS Nano, 4 (2010) 3181-3186.
Zhang, Y. et al., "Direct imprinting of microcircuits on graphene oxides film by femtosecond laser reduction," Nano Today, vol. 5, (2010) pp. 15-20.
Zhu, Y. et al., Carbon-Based Supercapacitors Produced by Activation of Graphene; Science, 332 (2011) 1537-1541.

(56) References Cited

OTHER PUBLICATIONS

Havener, R. et al., Hyperspectral Imaging of Structure and composition in Atomically Thin Heterostructures; ACS Nano, 13 (2013) 3942-3946.

Ko, S. et al., Unconventional, Laser Based OLED Material Direct Patterning and Transfer Method; Organic Light Emitting Diode—Material, Process and Devices; Intech, ISBN: 978-953-307-273-9.

Lee, K. et al., Effect of Laser Beam Trajectory on Donor Plate in Laser Induced Thermal Printing Process; Journal of the Optical Society of Korea, vol. 15, No. 4, Dec. 2011, pp. 362-367.

Cho, S. et al., Enhanced efficiency of organic light emitting devices (OLEDs) by control of laser imaging condition; Organic Electronics 13 (2012) 833-839.

Olivares-Marín, M. et al., Cherry stones as precursor of activated carbons for supercapacitors; Materials Chemistry and Physics 114, 1, (2009) 223-227.

An, L. et al., Optical and Sensing Properties of 1-Pyrenecarboxylic Acid-Functionalized Graphene Films Laminated on Polydimethylsiloxane Membrane, American Chemical Society, vol. 5, No. 2, (2011), pp. 1003-1011.

Le, L. et al., Graphene supercapacitor electrodes fabricated by inkjet printing and thermal reduction of graphene oxide, Electrochemistry Communications, vol. 13, (2011), pp. 355-358.

Le, L. et al., Inkjet-Printed Graphene for Flexible Micro-Supercapacitors, IEEE International Conference on Nanotechnology, Aug. 15-18, 2011, Portland, Oregon, USA, pp. 67-71.

Huang, L. et al., Graphene-Based Conducting Inks for Direct Inkjet Printing of Flexible Conductive Patterns and Their Applications in Electric Circuits and Chemical Sensors, Nano Res, (2011) 9 pages.

Jacoby, M., Graphene Moves Toward Applications, www.cen-online.org, Nov. 21, 2011, pp. 10-15.

Jang, B.Z. et al., Processing of nanographene platelets (NGPs) and NGP nanocomposites: a review; Journal of Materials Science 43, 5092-5101, (2008).

Jang, B.Z. et al., Graphene-Based Supercapacitor with an Ultrahigh Energy Density; NanoLetters, 10, 4863-4868, (2010).

U.S. Appl. No. 14/327,716, filed Jul. 10, 2014.
U.S. Appl. No. 14/327,753, filed Jul. 10, 2014.

* cited by examiner

HIGH-THROUGHPUT GRAPHENE PRINTING AND SELECTIVE TRANSFER USING A LOCALIZED LASER HEATING TECHNIQUE

CROSS-REFERENCE TO RELATED APPLICATION

The present application claims the benefit of U.S. Provisional Patent Application No. 61/766,956, filed on Feb. 20, 2013, which is incorporated by reference herein in its entirety.

FIELD OF THE INVENTION

The present invention relates to the field of nanofabrication of graphene patterns, in particular, utilizing a localized heat source, such as a laser beam, for localized graphene transfer from large-area graphene.

BACKGROUND OF THE INVENTION

The capability to produce high-quality graphene on a large scale has become a key factor in commercializing graphene-based technologies. Graphene exhibits extraordinary properties which can be utilized for many applications in various fields of science and engineering. A reliable, fast and economical fabrication technique is necessary for the commercialization of graphene-based products. Current techniques for producing graphene devices involve the use of photolithography or e-beam lithography to produce graphene devices having the necessary structures. Some of the disadvantages of these processes include high processing cost, long processing time, low yield, and unwanted doping of graphene. In addition, these processes are not compatible with flexible polymer substrates. Techniques where graphene patterns are printed using graphene ink overcome these disadvantages, but do not provide a continuous printed pattern. Hence, such techniques have limited use in applications such as nanoelectronics where the continuity of the graphene pattern may be critical to the performance of the device. Further, a continuous monolayer of graphene ribbon exhibits higher values of carrier mobility than a similar pattern printed with graphene ink.

The placement of electronic devices on flexible substrates has been a growing area for research and development due to rapidly expanding applications and markets for touch screens, electronic paper and displays, photovoltaics, lighting, and sensor tags. To achieve the economy of scale for large-area substrates requiring active transistor functionality, the primary focus has been to fabricate the electronics directly on the flexible substrate. The most promising materials and processes to date include thin-film metal oxide materials deposited by moderate temperature processes such as chemical vapor deposition (CVD) or atomic layer deposition (ALD), yet there are still concerns associated with substrate compatibility, throughput, and subsequent process integration for final device and circuit designs.

Conventional transparent conducting electrodes make use of indium tin oxide (ITO) and are commonly used in solar cells, touch sensors and flat panel displays. ITO is an essential element in virtually all flat-panel displays, including touch screens on smart phones and iPads, and is an element of organic light-emitting diodes (OLEDs) and solar cells. The element indium is becoming increasingly rare and expensive. ITO is also brittle, which heightens the risk of a screen cracking when a smart phone is dropped, and further rules ITO out as the basis for flexible displays. Graphene film is a strong candidate to replace ITO due to its high conductivity, good transparency, and good mechanical flexibility. Efforts to make transparent conducting films from large-area graphene, however, have been hampered by the lack of efficient methods for the synthesis, patterning and transfer of graphene at the scale and quality required for applications in high performance nanoelectronics.

Two properties of graphene (i.e., electron mobility and material flexibility) may be employed to facilitate the development of electronic components and circuits for various applications, such as flexible screens and very-high-performance transistors and electronic components. Recently, the large-scale growth of high-quality graphene on metal using CVD has enabled various applications. The fabrication of the graphene-based active component, however, requires complex, expensive and time-consuming processes using conventional lithography techniques. A simple process for the production of both graphene patterning and graphene transfer patterns is urgently needed to enable the fabrication of marketable graphene devices.

SUMMARY OF THE INVENTION

Embodiments of the present invention provide a technique that facilitates high-speed and high-throughput graphene pattern printing using localized heat sources, such as, but not limited to, lasers. In an embodiment of the present invention, large-area graphene is applied to a thermal release tape, and a substrate is placed in contact with the large-area graphene. In an embodiment of the present invention, a localized heat source, such as a laser beam, locally heats the thermal release tape such that the locally-heated area of the tape loses its adhesive properties, and the graphene on that locally-heated area of the thermal release tape is selectively transferred onto the substrate.

BRIEF DESCRIPTION OF THE DRAWINGS

For a more complete understanding of the present invention, reference is made to the following detailed description of an exemplary embodiment considered in conjunction with the accompanying drawings, in which.

DETAILED DESCRIPTION OF THE EXEMPLARY EMBODIMENT

Figure 1:
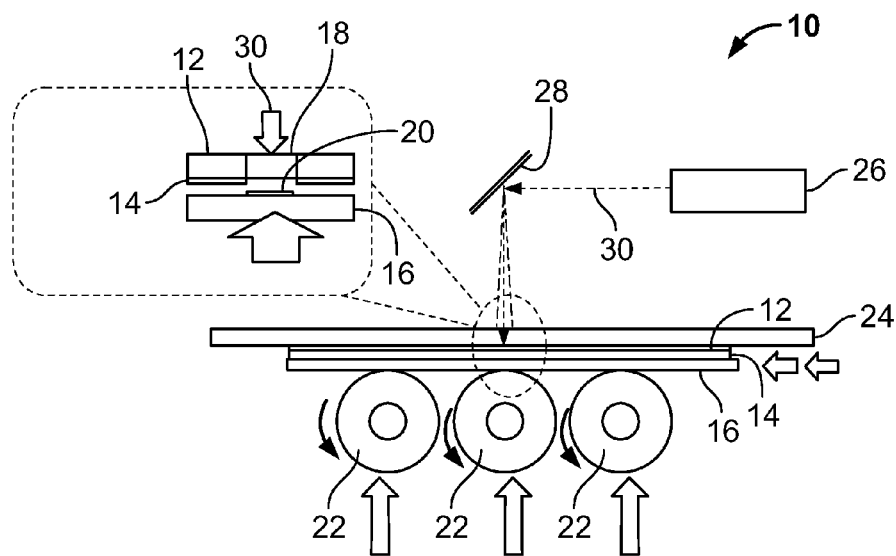
FIG. 1 is a schematic diagram of a system for implementing an exemplary method for printing graphene patterns on substrates using a laser beam as a localized heat source according to an embodiment of the present invention and showing a detail of the printing process.

FIG. 1 is a schematic diagram of an exemplary system 10 for implementing a method for printing graphene patterns on substrates using a laser beam as a localized heat source according to an embodiment of the present invention. A thermal release tape 12 is provided with one or more layers of large-area graphene 14 adhering thereto, and a substrate 16 is placed in contact with the large-area graphene 14. The thermal release tape 12 is of a type that loses its adhesive properties (i.e., becomes non-adhesive) when heated. Therefore, when the thermal release tape 12 is locally heated, the heated area 18 of the tape 12 loses its adhesive properties in the heated area 18, and the portion 20 of the large-area graphene 14 in the heated area 18 is selectively transferred onto the substrate 16. Suitable thermal release tapes (e.g., thermal release tape 3195MS, Semiconductor Equipment Corporation, Moorpark, Calif.) are commercially available.

Component parts of the exemplary system 10 may include a mechanism for pressing the thermal tape 12 against the substrate 16 at a precisely controlled pressure (e.g., a roller press comprising rollers 22 and fixed glass support 24, also referred to herein as a platen 24), a localized heat source (e.g., laser source 26 and deflectable mirror 28, one or both of the position and orientation of which may be controlled by a computer (not shown)), and a specially-prepared cartridge (not shown) for dispensing the thermal tape 12 with its adhered large-area graphene 14. In the exemplary method of the present invention, the thermal release tape 12 and the substrate 16 (e.g., a polyethylene terephthalate (PET) polymer film) are passed between the rollers 22 and the fixed glass platen 24 as illustrated in FIG. 1, with the rollers 22 applying a constant and uniform pressure against the thermal tape 12. The laser source 26 and deflectable mirror 28 are arranged on the opposite side of the glass platen 24 from the thermal tape 12, such that the laser beam 30 from the laser source 26 can be accurately focused onto desired locations on the thermal release tape 12 through the glass platen 24 by manipulating the deflectable mirror 28.

As the thermal release tape 12 and substrate 16 are rolled forward between the rollers 22 and glass platen 24, the laser beam 30 is sequentially focused on desired locations (e.g., heated area 18) on the thermal release tape 12 through the glass platen 24 using the deflectable mirror 28. The laser beam 30 thus heats up the desired area on the thermal release tape 12, elevating its temperature above the temperature at which the thermal release tape 12 loses its adhesive properties. In an embodiment of the present invention, the thermal release tape 12 loses its adhesive properties at a temperature of about 80° C., and the desired locations are heated to a temperature of about 150° C. The thermal release tape 12 loses its adhesive properties at the desired locations such that the graphene 14 is released from the thermal release tape 12 only at the desired locations and is transferred onto the substrate 16. In an embodiment of the present invention, a graphene pattern can be precisely printed onto the substrate 16 as the thermal release tape 12 and substrate 16 are advanced at a speed of about 150 to about 200 mm per minute.

Large Area Graphene Fabrication

The production of thermal release tape having large-area graphene adhered thereto may be carried out according to the following process of the present invention. The overall process involves large-area graphene fabrication on a transition metal substrate such as copper (Cu) foil via chemical vapor deposition (CVD). More particularly, in an embodiment of the present invention, a Cu scroll is placed in the center of a 2-inch diameter quartz tube in a horizontal 3-zone tube furnace, and heated to 1000° C. under hydrogen ($H_2$) and argon (Ar) flow. Reaction gas mixtures of methane ($CH_4$) at 50 sccm, $H_2$ at 15 sccm, and Ar at 1000 sccm are fed through the quartz tube. Subsequently, the Cu scroll is rapidly cooled to room temperature under $H_2$ and Ar flow, resulting in large-area graphene layers grown on both sides of the Cu scroll.

Large-area graphene is applied to the thermal release tape by adhering the graphene-copper surface to the thermal release tape at room temperature. To ensure uniform surface contact between the large-area graphene and the thermal release tape surface, pressure is applied to the copper/graphene/thermal release tape stack using a roll press or other suitable means of applying pressure. Then, the stack is placed in a copper etchant bath where the copper foil is etched away for about 12 hours. The remaining stack of large-area graphene and thermal transfer tape is then rinsed with DI water and dried using a nitrogen gun. The thermal release tape with its adhered large-area graphene may then be used in the exemplary printing process described above.

EXPERIMENTAL VERIFICATION

The following experiments (i.e., Experiment 1 and Experiment 2) have been conducted, and verify the utility of the present invention. Good uniform transfer of large-area graphene on the targeted substrate using a roller press was demonstrated (Experiment 1), and local heating of the thermal release tape was observed to consistently transfer graphene only in the locally heated areas (Experiment 2). The results of Experiments 1 and 2 are summarized below.

Experiment 1

Roller Press Method

Large-area graphene transfer onto a substrate was demonstrated using a roller-press apparatus. Silicone rollers were used to press multiple layers of large-area graphene adhered to a thermal release tape (thermal release tape 3195MS, Semiconductor Equipment Corporation) against a film of PET polymer at high temperatures (i.e., temperatures equal to or greater than about 100° C.), and a uniform pressure in the range of about 5 psi to about 10 psi. At high temperatures, the thermal release tape lost its adhesive properties and the graphene layer was transferred onto the PET substrate. Three temperatures were tested (i.e., 100° C., 120° C., and 150° C.). Care was taken to ensure that the PET film did not soften during the transfer process.

Homogeneous transfer of large-area graphene was observed at all three temperatures. The best transfer, based on the amount of large-area graphene transferred to the substrate and the uniformity of the large-area graphene transferred, was observed in the test run at 150° C.

It may be noted that thermal release tapes are commercially available having a range of adhesive and transfer characteristics. For example, there are tapes that lose their adhesive properties at temperatures higher than, or lower than, the thermal release tapes used in Experiment 1. Further, there are commercially available polymer substrates that exhibit different mechanical properties and temperature responses than those of PET films. Appropriate selections of thermal release tapes and polymer substrates may be made by those having ordinary skill in the art and possession of the present disclosure.

Experiment 2

Local Heating and Transfer Method

Figure 2:
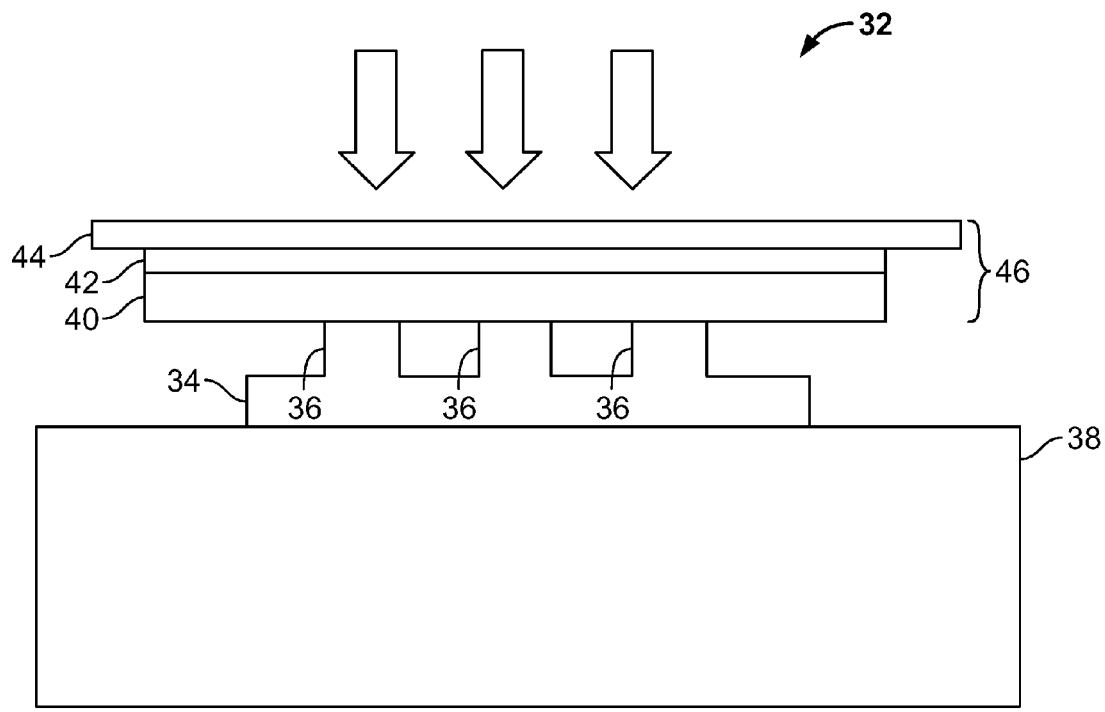
FIG. 2 is a schematic drawing of a system for implementing an exemplary method for localized transfer of graphene to a substrate using a localized heat source.

The feasibility of local graphene transfer from large-area graphene to a substrate was demonstrated by locally heating thermal release tape having large-area graphene adhered thereto. FIG. 2 is a schematic illustration of the experimental set-up 32 used for this experiment. Turning to FIG. 2 for reference, a silicon oxide wafer 34 with a pattern of 1 mm-diameter circular pedestals 36 was placed on a hot plate 38 and heated to 150° C. A thermal release tape 40 (thermal release tape 3195MS, Semiconductor Equipment Corporation) having large-area graphene 42 adhered thereto was placed with the graphene 42 in contact with a silicon substrate 44. The resulting stack 46 of substrate-graphene-tape was then placed carefully onto the heated circular pedestals 36 with the thermal release tape 40 in contact with the pedestals 36. Downward pressure was applied to the stack 46 using weights (not shown) placed on top of the silicon substrate 44, thereby pressing the thermal tape 40 against the heated pedestals 36. In the present experiment, a total of 10 pounds was applied. During this process, only the areas of the thermal release tape 40 that were heated by the pedestals 36 lost their adhesive properties, and graphene 42 was transferred onto the silicon substrate 44. The resulting transfer accurately produced circular areas of graphene (not shown) having diameters of 1 mm on the substrate 44.

The present experiment demonstrates that localized heating of thermal tape with large-area graphene adhered thereto can be used to accurately transfer a pattern of graphene to a substrate. As discussed elsewhere herein, precise heating of the thermal tape can be achieved using other sources of localized heating, such as a laser beam.

It will be understood that the embodiment of the present invention described herein is merely exemplary and that a person skilled in the art may make many variations and modifications without departing from the spirit and scope of the invention. For instance, all such variations and modifications are intended to be included within the scope of the invention as described in the appended claims.

We claim:

1. A method for selective transfer of graphene onto a substrate, comprising the steps of:
    providing a thermal release tape having graphene adhered thereto;
    placing a substrate against the graphene such that the graphene is positioned between the thermal release tape and the substrate;
    pressing the graphene against the substrate;
    heating a first localized portion of the thermal release tape using a localized heat source, thereby diminishing the adhesive properties of the thermal release tape at the first localized portion such that graphene from the localized portion is transferable to the substrate; and
    moving the localized heat source from the first localized portion of the thermal release tape to a second localized portion of the thermal release tape during said heating step, thereby forming a pattern of localized portions.

2. The method of claim 1, wherein the localized heat source is a laser beam, and said moving step includes reflecting the laser beam onto the thermal release tape using a deflectable mirror.

* * * * *